US008686483B2

(12) United States Patent
Michelot et al.

(10) Patent No.: US 8,686,483 B2
(45) Date of Patent: Apr. 1, 2014

(54) CHARGE TRANSFER PHOTOSITE

(75) Inventors: Julien Michelot, Grenoble (FR); Francois Roy, Seyssins (FR); Frederic Lalanne, Bernin (FR)

(73) Assignees: STMicroelectronics SA, Montrouge (FR); STMicroelectronics (Crolles 2) SAS, Crolles (FR)

( * ) Notice: Subject to any disclaimer, the term of this patent is extended or adjusted under 35 U.S.C. 154(b) by 65 days.

(21) Appl. No.: 13/398,287

(22) Filed: Feb. 16, 2012

(65) Prior Publication Data

US 2012/0211804 A1 Aug. 23, 2012

(30) Foreign Application Priority Data

Feb. 17, 2011 (FR) ..................................... 11 51318

(51) Int. Cl.
*H01L 31/062* (2012.01)

(52) U.S. Cl.
USPC ...................... 257/292; 257/E27.133; 438/75

(58) Field of Classification Search
USPC ............................. 257/292, E27.133; 438/75
See application file for complete search history.

(56) References Cited

U.S. PATENT DOCUMENTS

| | | | | |
|---|---|---|---|---|
| 6,486,521 | B2 * | 11/2002 | Zhao et al. | 257/443 |
| 6,781,171 | B2 * | 8/2004 | Jang et al. | 257/292 |
| 7,205,627 | B2 * | 4/2007 | Adkisson et al. | 257/463 |
| 7,224,011 | B2 * | 5/2007 | Jang | 257/292 |
| 7,408,211 | B2 * | 8/2008 | Kao | 257/292 |
| 7,777,289 | B2 * | 8/2010 | Roy et al. | 257/446 |
| 2004/0135067 | A1 * | 7/2004 | Jeon | 250/208.1 |
| 2005/0082631 | A1 * | 4/2005 | Mimuro et al. | 257/463 |
| 2006/0138494 | A1 * | 6/2006 | Lee | 257/292 |
| 2006/0186505 | A1 | 8/2006 | Adkisson et al. | |
| 2007/0023804 | A1 * | 2/2007 | Patrick | 257/292 |
| 2010/0002108 | A1 * | 1/2010 | Mabuchi | 348/294 |
| 2010/0176276 | A1 | 7/2010 | Ihara | |

* cited by examiner

*Primary Examiner* — Steven J Fulk
(74) *Attorney, Agent, or Firm* — Allen, Dyer, Doppelt, Milbrath & Gilchrist, P.A.

(57) ABSTRACT

A photosite may include, in a semi-conductor substrate, a photodiode pinched in the direction of the depth of the substrate including a charge storage zone, and a charge transfer transistor to transfer the stored charge. The charge storage zone may include a pinching in a first direction passing through the charge transfer transistor defining a constriction zone adjacent to the charge transfer transistor.

23 Claims, 4 Drawing Sheets

SECTION III-III'
A A' 70 91 30 60 80 60 90 50 TG SN 10 40 20

CHARGE TRANSFER PHOTOSITE

FIELD OF THE INVENTION

The present disclosure relates to imaging devices, more particularly, imaging devices having a matrix array of photosites, and a method for transferring charge within each photosite.

BACKGROUND OF THE INVENTION

An imaging device, or sensor, is a photosensitive electronic component that converts electromagnetic radiation into an analog electrical signal. This signal is thereafter amplified and then digitized by an analog-digital converter and finally processed to obtain a digital image.

The imaging device exploits the photoelectric effect, which allows the incident photons to tear electrons away at each active element, called a photosite (pixel). An imaging device generally comprises photosites arranged in a matrix, each photosite corresponding to a pixel of an image. The photons sensed by the imaging device based on semi-conductor components are converted into photocarriers in the silicon, i.e. into electron/hole pairs. More precisely, the charge created in the photosensitive zones is stored in the photosite before being read by an electronic system.

Two main families of imaging devices, or sensors, are available: charge transfer sensors, i.e. Charge-Coupled Device (CCD) sensors, and complementary metal-oxide semiconductors (CMOS) sensors, or CMOS Active Pixel Sensor (APS) sensors. A typical photosite generally comprises a photodiode intended to transform the sensed photons into a corresponding electrical signal by way of the photoelectric effect. Accordingly, the photodiode generally comprises a PN junction formed in a semi-conductor substrate.

Two types of photodiodes exist: photodiodes comprising solely a PN junction and pinched photodiodes comprising an N-doped layer lying between two P-doped layers, the N-doped layer being optimized so as to be completely deserted of free carriers after the charge transfer transistor control cycle. A PNP pinched photodiode differs from a photodiode comprising a simple PN junction in that it is coupled to a charge transfer gate, making it possible to control the charge transfer to the reading node, on the one hand, and in that the N-doped layer is deserted of any charge after the transfer. A PNP pinched photodiode thus allows correlated double sampling, i.e. sampling comprising on each occasion a measurement without charge followed by a measurement with charge.

Pinched photodiodes operate by accumulation of charge in a charge storage zone, then transfer of the charge into the capacitor of the reading node, and then measurements of the voltage delivered by this reading node by virtue of a follower transistor. Pinched photodiodes thus make it possible to accumulate a quantity of charge proportional to the luminous signal and to an integration time.

A pinched photodiode comprises a charge collection zone defined by the three layers respectively P1, N and P2 doped, and a charge storage zone comprising the N-doped layer. Under charge accumulation conditions, a turn-off potential is applied to the gate of the charge transfer transistor. A bias potential, for example, 0V, is also applied to the P1-doped and P2-doped layers. This bias potential for the P1-doped and P2-doped layers makes it possible to define a reference potential for the charge storage zone, i.e. the N-doped layer. The turn-off potential and the reference potential of the charge storage zone make it possible to define the boundary conditions of a potential well, which characterize the charge storage zone. The potential well thus defined depends not only on the value of the two potentials, but also on the value of the doping of the N-doped layer and the geometric dimensions of the photodiode.

Indeed, the dimensions of this potential well, especially its maximum depth corresponding to the depletion potential denoted $V_{max}$, i.e. the voltage of the potential well when it is empty of charge, are defined principally by the value of the effective doping ("Net doping") of the zones P1, P2 and N of the photodiode and by its geometric dimensions corresponding to its width, length and thickness. The thickness corresponds to the distance between the two junctions P1N and NP2.

The charge storage capacity of the photodiode, denoted $Q_{sat}$, depends on the dimensions of the potential well, especially the depletion potential and the volume of the storage zone. The depletion potential corresponds to the potential difference between the potential of the N layer where the potential well is maximized and the bias potential for the P1 and P2 layers when the N layer is completely deserted of free carriers.

The quality of the image obtained is defined, on the one hand, by the charge storage capacity within the potential well of the storage zone. Indeed, the electrical signal generated depends on the amount of charge stored and then transferred. But the quality of the image obtained is defined, on the other hand, by the charge transfer between the charge storage zone and the reading node via the charge transfer transistor.

Indeed, to obtain good image quality, it may be necessary that all the charge accumulated in the charge storage zone be transferred. If not all the charge is transferred for each of the photosites, there is a risk of electron noise in the image and a remnant effect, which may be present in the following image.

For example, two adjacent photosites that have received identical photons might not produce exactly the same image on account of the existence of residual charge in the photosites on completion of the charge transfer, and might therefore impair the quality of the image obtained. Moreover, in the case of two successively captured identical images, the latter might differ if the charge transfer is not total in each photosite.

Finally in a case where charge remains in the photodiode after the transfer, this charge might modify the following image, causing a remnant effect. The degree of transfer therefore directly affects the quality of the image obtained, via a disturbance of the electrical signal generated.

In a PNP pinched photodiode, the maximum quantity of charge stored in the charge storage zone varies with the depletion potential $V_{max}$, whereas the optimization of the charge transfer varies inversely with the depletion potential $V_{max}$. Indeed, to increase the charge storage capacity, $Q_{sat}$, the depletion potential $V_{max}$ may be increased, whereas to improve the charge transfer, the depletion potential $V_{max}$ may be decreased.

U.S. Patent Application Publication No. 2010/0176276 to Ihara discloses a photosite comprising a pinched photodiode and a charge transfer transistor whose shape has been modified so as to adopt a general T-shape. The T-shaped transfer transistor thus makes it possible to take the transistor above the zone of maximum charge storage, i.e. to the level of the charge storage zone where the potential corresponds to the depletion potential.

However, a configuration comprising a transfer transistor having a peninsular part going above the photodiode may have several drawbacks. On the one hand, a part of the photodiode is covered by the peninsular part of the charge transfer transistor and the area of the photon capture surface is consequently reduced. Indeed, the peninsular part of the charge transfer transistor situated above the photodiode, reflects and absorbs a considerable quantity of photons irradiating the photodiode.

Moreover, such a configuration may no longer make it possible to carry out a self-alignment of the photodiode with respect to the charge transfer transistor. Indeed, in such a configuration, the charge transfer transistor may be placed after the implantation of the photodiode in such a way that the peninsular part is positioned above the zone of maximum charge storage where the potential well is at its maximum. Whereas, in a conventional photosite production process, the photodiode is implanted after the transistor, the photodiode then aligned with respect to the transfer transistor.

SUMMARY OF THE INVENTION

According to an embodiment, a photosite whose topography is modified so as to bring the charge storage zone, where the potential well is at its maximum, i.e. the depletion potential, closer to the charge transfer transistor.

By bringing the charge storage zone, where the potential well is at its maximum, closer to the charge transfer transistor, it is possible to decrease the operating voltages of the transfer transistor and of the P-doped layers, on the one hand, and to increase the quantity of charge stored and transferred, on the other hand.

According to one aspect, a photosite may comprise, in a semi-conductor substrate, a photodiode pinched in the direction of the depth of the substrate comprising a charge storage zone, and a charge transfer transistor able to transfer the stored charge.

Additionally, the charge storage zone may comprise at least one pinching in a first direction passing through the transfer transistor defining at least one constriction zone adjacent to the charge transfer transistor. The pinching thus may make it possible to locate the position of the maximum of the potential well (depletion potential), no longer at the center of the photodiode but at a distance closer to the position of the charge transfer zone. The first direction is generally orthogonal to the direction of vertical pinching of the photodiode (along the depth of the substrate).

The pinching of the charge storage zone modifies the electrostatic potential of the charge storage zone so as to concentrate a maximum of charge in proximity to the charge transfer transistor, by defining a constriction zone, comprising the depletion potential, in proximity to the transfer gate. The photosite may comprise at least one region delimiting with the charge transfer transistor the at least one constriction zone.

In some embodiments, the distance between the at least one region and the charge transfer transistor along the first direction is greater than the distance between the at least one region and an edge of the charge storage zone along a second direction orthogonal to the first direction, in such a way that the maximum of electrostatic potential is located in proximity to the charge transfer transistor, thus favoring charge transfer. A restriction of the transverse dimension of the photodiode may be applied, the transverse dimension extending along the second direction orthogonal to the first direction. This transverse restriction may make it possible to optimize the electrostatic distribution of the charge storage zone. Indeed, this transverse restriction may avoid having a configuration of a wide photodiode with a central pinching, and for which the maximum of the potential well would not be adjacent to the charge transfer transistor.

Optionally, the charge storage zone may comprise a doping adjusted so that the potential well of the constriction zone has a depletion potential lying between a base voltage defined by the potential difference between the surface potential under the gate of the transfer transistor when the transfer transistor is off and the surface potential under the gate of the transfer transistor when the transfer transistor is on, and fifty percent of the base voltage.

The pinching in the first direction modifies the electrostatic distribution and, consequently, the depletion potential, which decreases with the width of the potential well. For the sake of simplicity of notation, the pinching in the first direction may be dubbed lateral pinching.

The depletion potential varies more quickly with the geometric dimensions of the charge storage zone than with the doping. On the other hand, the charge storage capacity, $Q_{sat}$, varies proportionally both with the doping and with the geometric dimensions of the charge storage zone. Thus, by pinching the photodiode laterally, the storage capacity may be increased for an identical depletion potential between a photodiode pinched laterally and a photodiode not pinched laterally.

In a first-order approximation, the depletion potential varies proportionally with the doping of the charge storage zone and quadratically with each of the geometric dimensions of the charge storage zone. In this same approximation, the quantity of charge in the charge storage zone may vary proportionally with the doping and each of the dimensions of the charge storage zone.

For example, within the framework of a first-order approximation, if one of the geometric dimensions of the charge storage zone is reduced by a factor of 2, the depletion potential may be decreased by a factor of 4. To obtain one and the same depletion potential, the doping may then be increased by a factor of 4. The charge storage capacity may vary linearly with the value of the doping and each of the dimensions of the charge storage zone. The charge storage capacity may be increased by a factor of 2 with respect to a conventional photodiode.

Moreover, the depletion potential of the potential well may remain less than the base voltage so that the charge transfer can be carried out completely, i.e. in such a way that no residual charge remains. Advantageously, the at least one region may comprise a doped zone of a type of conductivity opposite to the type of conductivity of the charge storage zone. The portions of the charge storage zone on either side of the at least one region can advantageously be symmetric with respect to the first direction.

In a first embodiment, the at least one region can comprise a blob, or pinching islet situated at least within the charge storage zone. In other embodiments, the distance between the pinching islet and the charge transfer transistor is greater than the distance between the pinching islet and that edge of the charge storage zone, which is situated on the opposite side from the charge transfer transistor with respect to the islet, so that the maximum of electrostatic potential is located in proximity to the charge transfer transistor, thus favoring charge transfer.

In a second embodiment, the at least one region can comprise a pinching peninsula extending from an edge of the photosite in the direction of the charge transfer transistor. In a configuration where the photosite comprises only a peninsular region, the charge storage zone may comprise a general U-shape with a base adjoining the charge transfer transistor and defining the constriction zone.

According to another aspect, there is proposed an imaging device that may comprise a matrix array of photosites comprising at least one photosite as described hereinabove.

BRIEF DESCRIPTION OF THE DRAWINGS

Other advantages and characteristics of the present disclosure may be apparent on examining the detailed description of a wholly non-limiting embodiment, and the appended drawings in which:

FIGS. 1*b* and 1*c* are diagrams of potential curves of the photosite of FIG. la respectively when the transfer transistor is turned off and when it is on;

FIGS. 3*b* and 3*c* are diagrams of potential curves of the photosite of FIG. 3*a*, respectively when the transfer transistor is turned off and when it is on;

DETAILED DESCRIPTION OF THE PREFERRED EMBODIMENTS

Figure 1A:
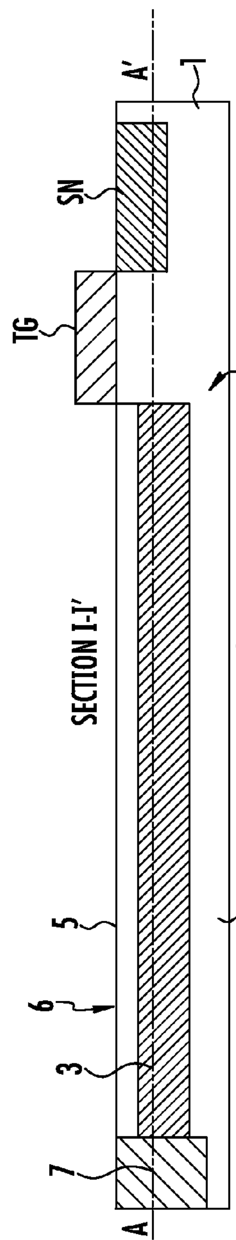
FIG. 1*a* is cross-sectional view of a photosite, according to the prior art.

FIG. 1*a* represents in a schematic manner a transverse sectional view of a conventional photosite according to the prior art. More particularly, the view is a transverse section cut along the direction of charge transfer defined by the axis I-I' in FIG. 2. The conventional photosite is formed in a semi-conductor substrate 1 comprising a pinched (stretched) photodiode 2 coupled to a charge transfer transistor TG which is coupled to a measurement node SN remote from the pinched photodiode 2.

In a conventional manner, a charge transfer transistor TG is placed on an initially P-doped substrate 1. The pinched photodiode 2 is thereafter formed so as to be aligned with respect to the charge transfer transistor TG, i.e. so as to be adjacent to the charge transfer transistor TG. The pinched photodiode 2 is formed by carrying out a first implantation of an N-doped layer 3 carried out within a P-doped layer 4 of substrate 1, followed by a second implantation of a P-doped layer 5 carried out so as to be overlaid on the N-doped layer 3.

A pinched photodiode 2 is thus obtained, comprising a photosensitive zone 6 delimited in part on the periphery by a peripheral region 7, the photosensitive zone 6 comprising an N-doped layer 3 lying between two P-doped layers 4 and 5. The photodiode comprises a charge collection zone comprising the three layers 4, 3 and 5 respectively doped P, N and P as well as the P-doped peripheral region, and a charge storage zone corresponding to the N-doped layer 3. The charge storage zone gathers and accumulates the charge of the photocarriers that are created in the charge collection zone of the photodiode 2.

The diode is biased by the application of a bias potential to the P-doped layer 4 inducing a bias of the layers 5 and 7 also P-doped to the same potential. The bias of the diode thus allows storage of the charge in the N-doped layer 3. Moreover, a voltage is also applied to the gate of the charge transfer transistor TG, the voltage being different depending on whether the photosite is in a charge accumulation configuration or else in a configuration for transferring the accumulated charge to the measurement node SN.

Figure 1B:
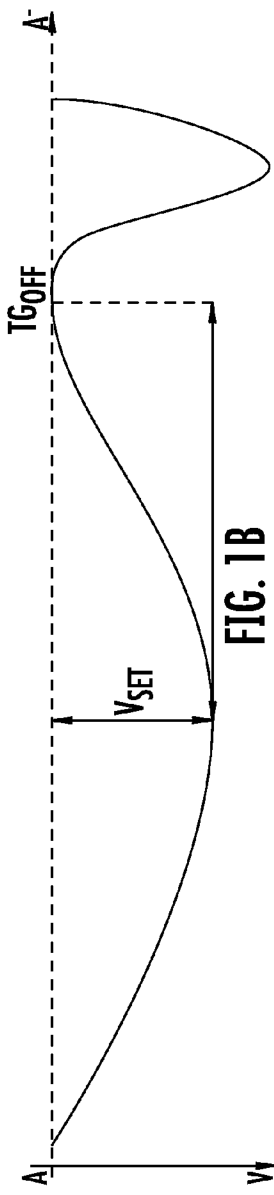
Figure 1C:
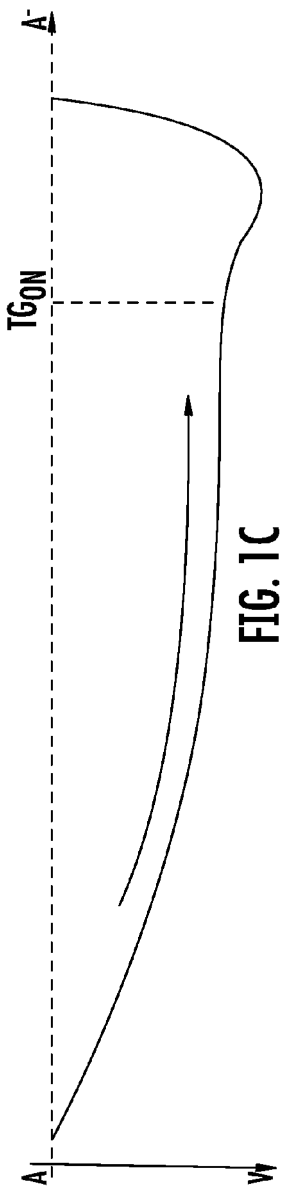

FIGS. 1*b* and 1*c* schematically present the curves of potential of the conventional photosite of FIG. la respectively when the charge transfer transistor TG is off and when it is on. The potentials represented correspond to the potentials to be measured according to a plane AA' of FIG. 1*a*.

The charge transfer transistor TG is turned off when a voltage of the order of −1V, for example, is applied to the gate of the transistor TG. Turning off the charge transfer transistor TG makes it possible to accumulate charge of photocarriers that are created by the photons sensed in the photodiode 2 of the photosite.

The curve of FIG. lb represents the surface potential $TG_{off}$ under the gate of the charge transfer transistor TG when the transistor TG is turned off. When the charge transfer transistor TG is turned off, a potential well forms in the photodiode 2, the charge transfer transistor TG forming a potential barrier separating the charge storage zone of the photodiode 2 from the measurement node SN.

The potential well is characterized by its maximum depth corresponding to the depletion potential $V_{max}$, and by the distance separating the zone of the depletion potential $V_{max}$ and the zone of the charge transfer transistor TG. The depletion potential $V_{max}$ corresponds to the voltage intrinsic to the potential well of the charge storage zone where the electrostatic potential is at its maximum when this zone is empty of any charge. It is defined by the potential difference between the maximum potential of the potential well and the bias potential of the P-doped zones 4, 5 and 7.

Once the charge storage zone is filled, the charge is transferred from the photodiode 2 to the measurement node SN via the charge transfer transistor TG. As illustrated in FIG. 1*c*, the potential barrier created by the charge transfer transistor TG is lowered by modifying the voltage applied to the gate of the transistor TG. The voltage is, for example, taken to 3V. The change of voltage applied to the gate of the charge transfer transistor TG consequently modifies the surface potential measured under the gate of the charge transfer transistor TG.

Charge transfer is complete when no residual charge exists in the charge storage zone on completion of the transfer. If the depletion potential $V_{max}$ is greater than the surface potential $TG_{on}$ measured under the gate when the charge transfer transistor TG is on, it is then possible that charge may not be transferred and may remain in the charge storage zone, thus creating residual charge. This is because the potential barrier of the charge transfer transistor TG has not been lowered sufficiently with respect to the depletion potential $V_{max}$ defining the potential well.

Figure 2:
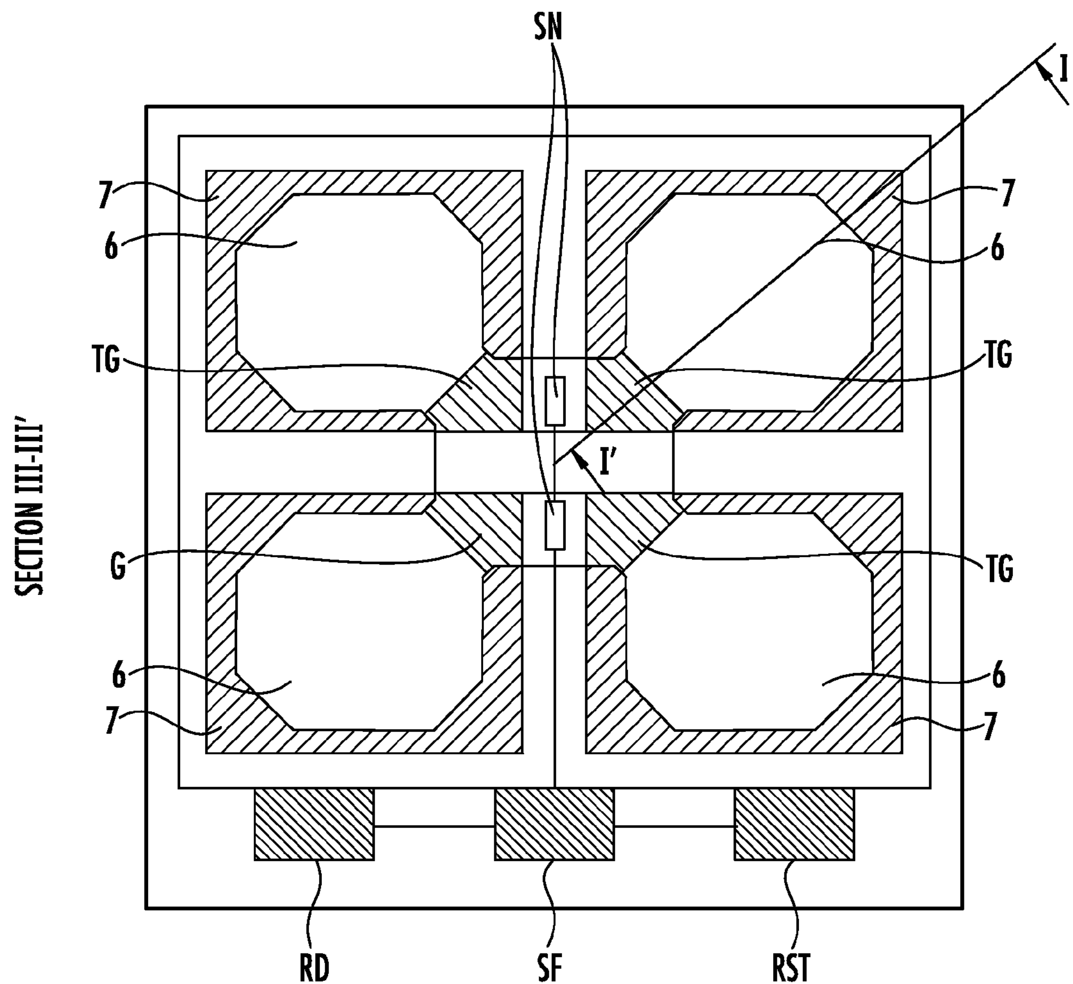
FIG. 2 is a top side plan view of a set of four photosites, according to the prior art.

FIG. 2 illustrates a view from above of a set of four conventional photosites produced according to FIG. 1*a*. The set comprises four conventional photosites produced in a semiconductor substrate 1. Each conventional photosite comprises a charge transfer transistor TG coupled to a measurement node SN and a photodiode 2. The photodiode 2 comprises a photosensitive zone 6 delimited by a peripheral region 7 making it possible to separate the photodiode 2 from the other photosites. The measurement nodes SN of the four photosites are coupled in a common manner to a follower transistor SF (source follower), a reading transistor RD (Read), and a reset transistor RST (Reset).

Figure 3A:
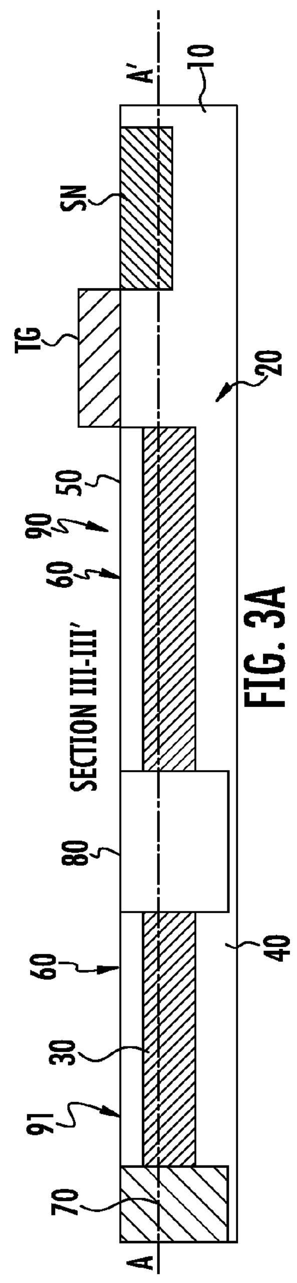
FIG. 3*a* is cross-sectional view of a photosite, according to the present invention.

FIG. 3*a* illustrates in a schematic manner a transverse sectional view along the direction of transfer of a photosite according to a first embodiment. In this first embodiment, a photosite 100 is formed in a semi-conductor substrate 10 comprising a pinched photodiode 20 coupled to a charge transfer transistor TG, which is coupled to a measurement node SN remote from the pinched photodiode 20.

The charge transfer transistor TG is placed on the initially P-doped substrate 10. The pinched photodiode 20 is thereafter formed so as to be aligned with respect to the charge transfer transistor TG, i.e. to be adjacent to the charge transfer transistor TG. The pinched photodiode 20 is formed by carrying out a first implantation of an N-doped layer 30 carried out within a P-doped layer 40 of substrate, followed by a second implantation of a P-doped layer 50 carried out so as to be overlaid on the N-doped layer 30.

A vertically (i.e. along the depth) pinched photodiode 20 is thus obtained, comprising a photosensitive zone 60 delimited in part at the periphery by a peripheral region 70 corresponding to a P-doped layer, the photosensitive zone 60 comprising an N-doped layer 30 lying between two P-doped layers 40 and 50. The photosensitive zone 60 of the photodiode 20 comprises a charge collection zone comprising the three layers 40, 30 and 50 respectively doped P, N and P as well as the P-doped peripheral region 70, which can participate in the collection of charge, and a charge storage zone corresponding to the N-doped layer 30.

A fourth implantation is thereafter carried out. The fourth implantation corresponds to a specific implantation so as to create a pinching zone 80 within the photosensitive zone 60 of the photodiode 20. The implantation of this pinching zone 80 may advantageously be carried out at the same time as the implantation of the peripheral region 70 delimiting the photosensitive zone 60. The pinching zone 80 is produced over a depth corresponding at least to the sum of the layers 50 and 30.

Figure 3B:
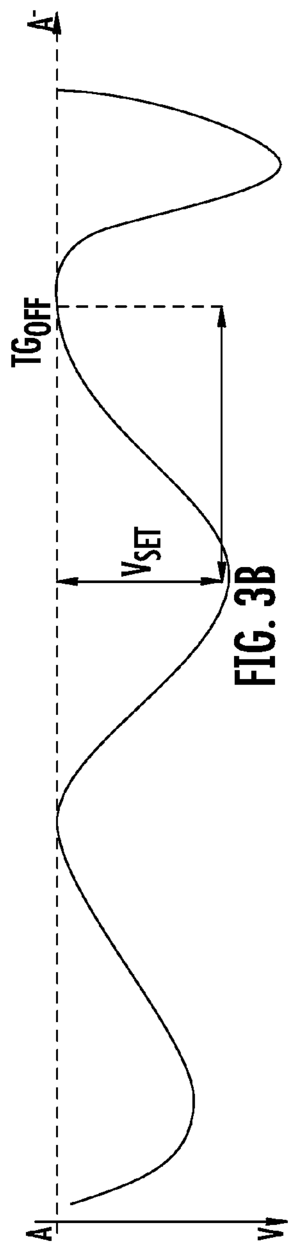
Figure 3C:
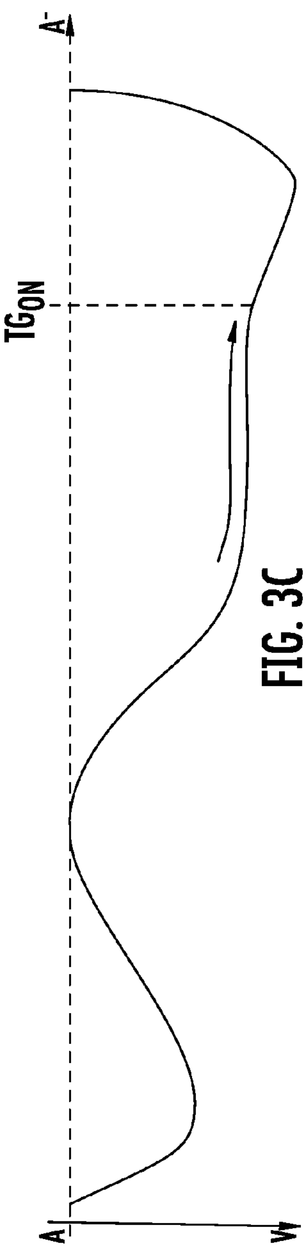

FIGS. 3*b* and 3*c* schematically present the curves of potential of the photosite 100 of FIG. 3*a* respectively when the transfer transistor is off and when it is on. The potentials correspond to the potentials to be measured along the direction of transfer in a plane AA' of FIG. 3*a*. When the charge transfer transistor TG is turned off, that is to say when the photodiode is able to absorb charge of photocarriers created by the photons sensed in the photodiode of the photosite, a curve of the potentials according to the plane AA' illustrated in FIG. 3*b* is observed.

With respect to the curve of potential of FIG. 1*b* of a conventional photosite, the charge storage zone where the electrostatic potential is at its maximum has been brought closer to the potential barrier of the charge transfer transistor TG, whereas the value of the depletion potential $V_{max}$ is the same.

The introduction of the pinching zone 80 within the photosensitive zone 60 of the photodiode causes a lateral pinching of the photodiode 20, especially in a first direction passing through the charge transfer transistor TG, defining a constriction zone 90, and consequently modifying the electrostatic distribution of the charge storage zone corresponding to the layer 30. The pinching zone 80 is implanted in an off-centered manner, further from the charge transfer transistor TG than from the end of the photodiode 20 opposite from the transistor TG. The distance separating the charge transfer transistor TG from the pinching zone 80 is greater than the distance separating the pinching zone 80 from the end of the photodiode 20 opposite from the transistor TG, and more generally greater than the distance separating the pinching zone 80 from any point of the peripheral region 70.

In this way, by bringing the charge storage zone where the electrostatic potential is at its maximum, i.e. the depletion potential, closer to the charge transfer transistor TG, a maximum of stored charge is concentrated in proximity to the charge transfer transistor TG, in the constriction zone 90 thus defined. The lateral pinching modifies the depletion potential $V_{max}$. Indeed, for slender geometries, that is to say for small photosites, the depletion potential $V_{max}$ decreases quadratically with the width of the potential well in a first-order approximation. Moreover, the depletion potential $V_{max}$ increases linearly with the doping of the layer 30 in a first-order approximation.

It is thus possible to achieve a value of depletion potential $V_{max}$ that is equal to the depletion potential $V_{max}$ for a conventional photosite not comprising any lateral pinching, without losing in terms of charge storage capacity, $Q_{sat}$, or even while increasing the charge storage capacity, $Q_{sat}$. Indeed, the charge storage capacity $Q_{sat}$ varies proportionally with the doping of the charge storage zone 30 and with the geometric dimensions of the charge storage zone 30 in a first-order approximation. For one and the same value of depletion potential $V_{max}$, the maximum charge storage capacity $Q_{sat}$ is therefore greater than in a case where the photodiode is not pinched in the direction of transfer.

Moreover, the value of the depletion potential $V_{max}$ is less than the difference in potentials between the surface potential $TG_{off}$ under the gate of the charge transfer transistor TG when it is turned off, and the surface potential $TG_{on}$ under the gate of the charge transfer transistor TG when it is on. In this way, residual charge is prevented from appearing on completion of a charge transfer.

Figure 4:
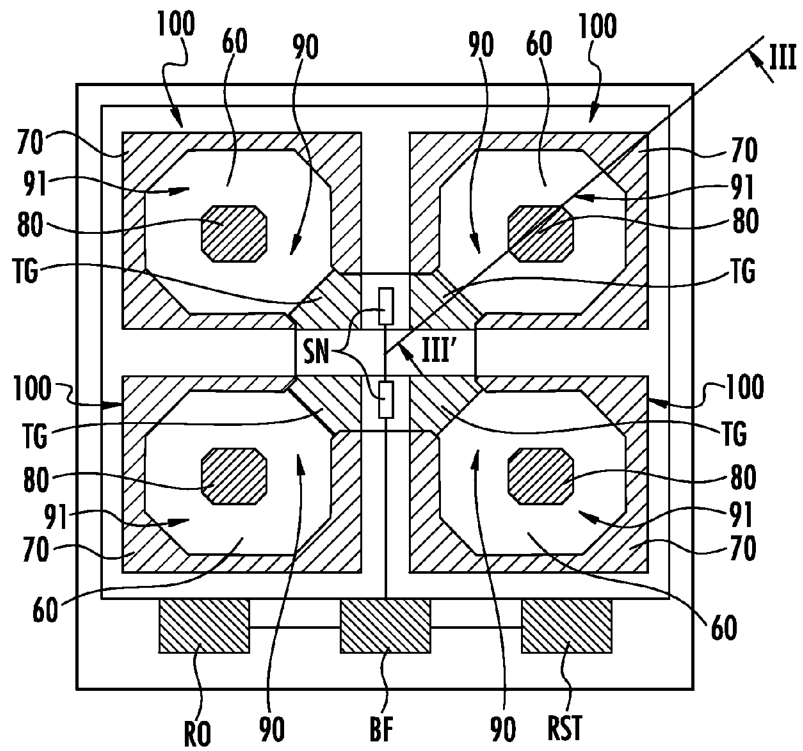
FIG. 4 is a top side plan view of a set of four photosites according to a first embodiment of the present invention.

FIG. 4 illustrates a view from above of a set of four photosites according to the embodiment of FIG. 3*a*. The set comprises four photosites 100 produced in a semi-conductor substrate 10. Each photosite 100 comprises a charge transfer transistor TG coupled to a measurement node SN and a photodiode 20. The measurement nodes SN of the four photosites are coupled in a common manner to a follower transistor SF (source follower), a reading transistor RD (Read) and a reset transistor RST (Reset).

The photodiode 20 of each photosite comprises a photosensitive zone 60 delimited by a peripheral region 70 making it possible to isolate the photodiode 20 from the other photosites, and an islet-shaped (island-shaped) pinching zone 80. The islet is off-center with respect to the center of the photosite 100 over a first direction passing through the center of the photosensitive zone 60 and the charge transfer transistor TG. The pinching zone 80 is off-center in such a way that the constriction 90 between the pinching zone 80 and the charge transfer transistor TG is wider than the region 91 defined between the pinching zone 80 and the peripheral region 70. In this way, the charge storage zone where the electrostatic potential is at its maximum is adjacent to the charge transfer transistor TG.

Figure 5:
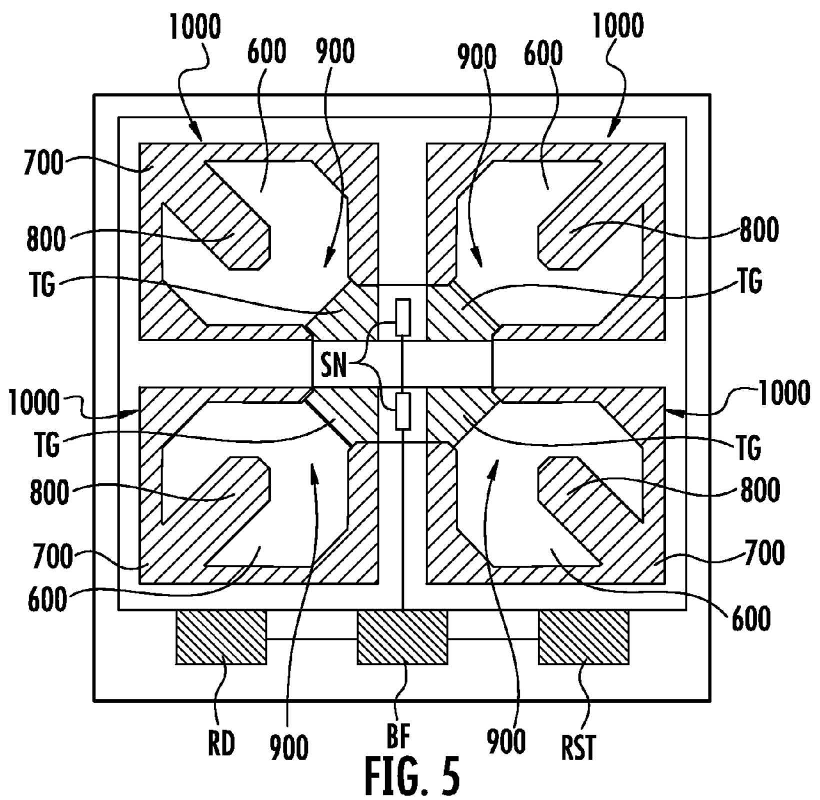
FIG. 5 is a top side plan view of a set of four photosites according to a second embodiment of the present invention.

FIG. 5 illustrates a view from above of a set of four photosites according to a second embodiment. Reference numerals identical to the reference numerals of FIG. 4 designate identical elements. In this second embodiment, the set comprises four photosites 1000 produced in a semi-conductor substrate 10. Each photosite 1000 comprises a pinching zone 800 produced in such a way that the photosensitive zone 600 has a general U shape, the base of the U adjoining the charge transfer transistor TG and forming a constriction zone 900. The pinching zone 800 corresponds to a peninsular isolating zone facing the charge transfer transistor TG. The pinching zone 800 is dimensioned in such a way that the zone of maximum charge storage is adjacent to the charge transfer transistor TG.

Such photosites comprising a lateral pinching make it possible to increase the quantity of charge stored within a photodiode and to optimize the charge transfer in such a way that there is no residual charge, without necessarily adding further steps in the production of the photosite since the isolating zone may be implanted simultaneously with the peripheral isolating regions, and while preserving the order of the fabrication steps thus making it possible to benefit from the self-alignment of the photodiode with respect to the charge transfer transistor of the photosite.

The proposed photosite comprises a topography modified to bring the charge storage zone where the potential well is at its maximum, that is to say the depletion potential, closer to the charge transfer transistor. Thus, it is possible to decrease the operating voltages of the transfer transistor and of the P-doped layers, or to increase the quantity of charge stored and transferred.

That which is claimed is:

1. An imaging pixel comprising:

a semiconductor substrate;

a photodiode in said semiconductor substrate and comprising a charge storage zone; and a charge transfer transistor configured to transfer stored charge in said charge storage zone;

said charge storage zone being pinched in a first direction passing through said charge transfer transistor and configured to define at least one constriction zone adjacent to said charge transfer transistor, the at least one constriction zone configured to shift a threshold potential well point towards said charge transfer transistor.

2. The imaging pixel according to claim 1 further comprising at least one region cooperating with said charge transfer transistor to delimit said at least one constriction zone.

3. The imaging pixel according to claim 2 wherein a distance between said at least one region and said charge transfer transistor along the first direction is greater than a distance between said at least one region and an edge of said charge storage zone along a second direction orthogonal to the first direction.

4. The imaging pixel according to claim 2 wherein said at least one region comprises a doped zone of a type of conductivity opposite to a type of conductivity of said charge storage zone.

5. The imaging pixel according to claim 2 wherein portions of said charge storage zone on either side of said at least one region are symmetric with respect to the first direction.

6. The imaging pixel according to claim 2 wherein said at least one region comprises a pinching island situated in said charge storage zone.

7. The imaging pixel according to claim 6 wherein a distance between said pinching island and said charge transfer transistor is greater than a distance between said pinching island and an edge of said charge storage zone situated on an opposite side from said charge transfer transistor with respect to said pinching island.

8. The imaging pixel according to claim 2 wherein said at least one region comprises a pinching peninsula extending from an edge of said semiconductor substrate and in a direction of said charge transfer transistor.

9. The imaging pixel according to claim 1 wherein said charge storage zone has a doping concentration value, the doping concentration value defining a potential well of said at least one constriction zone to have a depletion voltage between a base voltage and one half of the base voltage.

10. The imaging pixel according to claim 9 wherein the base voltage is defined by a difference between a gate surface potential of said charge transfer transistor when said charge transfer transistor is turned off and the gate surface potential of said charge transfer transistor when said charge transfer transistor is tuned on.

11. An imaging device comprising:

a matrix array of imaging pixels, each imaging pixel comprising a semiconductor substrate, a photodiode in said semiconductor substrate and comprising a charge storage zone, and a charge transfer transistor configured to transfer stored charge in said charge storage zone, said charge storage zone being pinched in a first direction passing through said charge transfer transistor and configured to define at least one constriction zone adjacent to said charge transfer transistor, the at least one constriction zone configured to shift a threshold potential well point towards said charge transfer transistor.

12. The imaging device according to claim 11 wherein each imaging pixel further comprises at least one region cooperating with said charge transfer transistor to delimit said at least one constriction zone.

13. The imaging device according to claim 12 wherein a distance between said at least one region and said charge transfer transistor along the first direction is greater than a distance between said at least one region and an edge of said charge storage zone along a second direction orthogonal to the first direction.

14. The imaging device according to claim 12 wherein said at least one region comprises a doped zone of a type of conductivity opposite to a type of conductivity of said charge storage zone.

15. The imaging device according to claim 11 wherein said charge storage zone has a doping concentration value, the doping concentration value defining a potential well of said at least one constriction zone to have a depletion voltage between a base voltage and one half of the base voltage.

16. The imaging device according to claim 15 wherein the base voltage is defined by a difference between a gate surface potential of said charge transfer transistor when said charge transfer transistor is turned off and the gate surface potential of said charge transfer transistor when said charge transfer transistor is tuned on.

17. A method of making an imaging pixel in a semiconductor substrate, the method comprising:

forming a photodiode in the semiconductor substrate, the photodiode comprising a charge storage zone;

forming a charge transfer transistor in the semiconductor substrate to transfer stored charge in the charge storage zone; and forming the photodiode so that the charge storage zone is pinched in a first direction passing through the charge transfer transistor and for defining at least one constriction zone adjacent to the charge transfer transistor, the at least one constriction zone shifting a threshold potential well point towards the charge transfer transistor.

18. The method according to claim 17 further comprising forming at least one region cooperating with the charge transfer transistor to delimit the at least one constriction zone.

19. The method according to claim 18 further comprising forming the at least one region to comprise a doped zone of a type of conductivity opposite to a type of conductivity of the charge storage zone.

20. The method according to claim 18 further comprising forming the at least one region to comprise a pinching peninsula extending from an edge of the semiconductor substrate and in a direction of the charge transfer transistor.

21. The method according to claim 18 wherein a distance between the at least one region and the charge transfer transistor along the first direction is greater than a distance between the at least one region and an edge of the charge storage zone along a second direction orthogonal to the first direction.

22. The method according to claim 17 further comprising forming the charge storage zone to have a doping concentration value, the doping concentration value defining a potential well of the at least one constriction zone to have a depletion voltage between a base voltage and one half of the base voltage.

23. The method according to claim 22 wherein the base voltage is defined by a difference between a gate surface potential of the charge transfer transistor when the charge transfer transistor is turned off and the gate surface potential of the charge transfer transistor when the charge transfer transistor is tuned on.

* * * * *

UNITED STATES PATENT AND TRADEMARK OFFICE

CERTIFICATE OF CORRECTION

PATENT NO. : 8,686,483 B2
APPLICATION NO. : 13/398287
DATED : April 1, 2014
INVENTOR(S) : Julien Michelot, Francois Roy and Frederic Lalanne It is certified that error appears in the above-identified patent and that said Letters Patent is hereby corrected as shown below:

In the Claims

| | |
|---|---|
| Column 9, Line 67<br>Claim 10 | Delete: "tuned"<br>Insert: --turned-- |
| Column 10, Line 40<br>Claim 16 | Delete: "tuned"<br>Insert: --turned-- |
| Column 11, Line 15<br>Claim 23 | Delete: "tuned"<br>Insert: --turned-- |

Signed and Sealed this
Sixteenth Day of June, 2015

Michelle K. Lee

Michelle K. Lee
*Director of the United States Patent and Trademark Office*